US010439003B1

(12) United States Patent
Cheng et al.

(10) Patent No.: US 10,439,003 B1
(45) Date of Patent: Oct. 8, 2019

(54) ORGANIC LIGHT-EMITTING DISPLAY PANEL AND DISPLAY DEVICE

(71) Applicant: Shanghai Tianma AM-OLED Co., Ltd., Shanghai (CN)

(72) Inventors: Shuang Cheng, Shanghai (CN); Jinghua Niu, Shanghai (CN); Xiangcheng Wang, Shanghai (CN); Qing Zhu, Shanghai (CN); Yibin Xing, Shanghai (CN); Jianyun Wang, Shanghai (CN); Yinhe Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/229,343

(22) Filed: Dec. 21, 2018

(30) Foreign Application Priority Data

Aug. 2, 2018 (CN) .......................... 2018 1 0872982

(51) Int. Cl.
*H01L 27/32* (2006.01)
*H01L 51/50* (2006.01)
*H01L 51/52* (2006.01)

(52) U.S. Cl.
CPC ...... *H01L 27/3206* (2013.01); *H01L 51/5036* (2013.01); *H01L 51/5218* (2013.01); *H01L 51/5234* (2013.01); *H01L 51/5256* (2013.01); *H01L 2251/5323* (2013.01)

(58) Field of Classification Search
CPC ............ H01L 27/3206; H01L 51/5234; H01L 51/5036; H01L 51/5256; H01L 51/5218; H01L 2251/5321
See application file for complete search history.

(56) References Cited

U.S. PATENT DOCUMENTS

2011/0175123 A1 7/2011 Koh et al.

*Primary Examiner* — Anthony Ho
(74) *Attorney, Agent, or Firm* — Tarolli, Sundheim, Covell & Tummino LLP

(57) ABSTRACT

An organic light-emitting display panel and a display device are provided. The display panel includes a plurality of organic light-emitting components, wherein each of the plurality of organic light-emitting components comprises a first electrode, a light-emitting layer and a second electrode that are arranged by stacking, the first electrode has a reflectivity of R1, and the second electrode has a reflectivity of R2, R1 and R2 satisfy:

$$\begin{cases} I1 = F(R1, R2, \lambda, X1, L) \times I0 \\ I2 = F'(R1, R2, \lambda, X2, L) \times I0 \\ \left| \frac{I1}{I0} - \frac{I2}{I0} \right| < 0.13 \end{cases},$$

wherein I1 is a light intensity at a side of the first electrode, I2 is a light intensity at a side of the second electrode, I0 is an intrinsic light intensity of the light-emitting layer, λ is a wavelength of light emitted by the light-emitting layer, X1 is a distance between an exciton recombination center in the light-emitting layer and the first electrode, and L is a length of a microcavity between the first electrode and the second electrode, wherein X1+X2=L.

17 Claims, 8 Drawing Sheets

11'
1'
12'

ORGANIC LIGHT-EMITTING DISPLAY PANEL AND DISPLAY DEVICE

CROSS-REFERENCE TO RELATED APPLICATIONS

The present disclosure claims priority to Chinese Patent Application No. 201810872982.1, filed on Aug. 2, 2018, the content of which is incorporated herein by reference in its entirety.

TECHNICAL FIELD

The present disclosure relates to the field of display technologies, and particularly, to an organic light-emitting display panel and a display device.

BACKGROUND

At present, display technologies have been applied to every aspect of people's daily lives, and accordingly, more and more materials and technologies have been used for display screens. Nowadays, mainstream display screens mainly include liquid crystal display screens and organic light-emitting display panels. Due to the self-luminous property of the organic light-emitting display panel, the most energy-consuming backlight module is omitted compared with the liquid crystal display screen, so that the organic light-emitting display panel has the advantage of being more energy-saving.

However, the organic light-emitting display panel in the related art can display only at a single side, that is, cannot be applied for a scenario which requires display at double sides, for example, a billboard along a road that needs to display images at two opposite sides.

SUMMARY

In view of the above, the present disclosure provides an organic light-emitting display panel and a display device, which can be applied for a scenario which requires display at double sides.

In a first aspect of the present disclosure, an organic light-emitting display panel is provided. The organic light-emitting display panel includes a plurality of organic light-emitting components, wherein each of the plurality of organic light-emitting components comprises a stack of a first electrode, a light-emitting layer and a second electrode, the first electrode has a reflectivity of R1, the second electrode has a reflectivity of R2, and for a same one of the plurality of organic light-emitting components, R1 and R2 satisfy:

$$\begin{cases} I1 = F(R1, R2, \lambda, X1, L) \times I0 \\ I2 = F'(R1, R2, \lambda, X2, L) \times I0 \\ \left|\frac{I1}{I0} - \frac{I2}{I0}\right| < 0.13 \end{cases},$$

wherein I1 is a light intensity at a side of the first electrode, I2 is a light intensity at a side of the second electrode, I0 is an intrinsic light intensity of the light-emitting layer, F (R1, R2, λ, X1, L) is a first function associated with R1, R2, 2, X1 and L, F' (R1, R2, λ, X2, L) is a second function associated with R1, R2, λ, X2 and L, λ is a wavelength of light emitted by the light-emitting layer, X1 is a distance between an exciton recombination center in the light-emitting layer and the first electrode, X2 is a distance between the exciton recombination center in the light-emitting layer and the second electrode, and L is a length of a microcavity between the first electrode and the second electrode, wherein X1+X2=L, 5%≤R1≤95%, and 5%≤R2≤95%.

In a second aspect of the present disclosure, a display device is provided. The display device includes any one of the display panel provided in the present disclosure.

With the organic light-emitting display panel and the display device in the embodiments of the present disclosure, on the one hand, since each of the first electrode and the second electrode in the organic light-emitting component is a semi-transparent electrode, a microcavity is formed between the two electrodes to enhance a light intensity and to realize emitting light at double sides; on the other hand, by determining reflectivity of the first electrode and the second electrode, the difference in the light intensity of the double-sided light is ensured to be small, and the display effect is further improved.

BRIEF DESCRIPTION OF DRAWINGS

In order to more clearly illustrate technical solutions of embodiments of the present disclosure or in the related art, the accompanying drawings used in the embodiments in the related art are briefly described below. The drawings described below are a part of the embodiments of the present disclosure. Based on these drawings, those skilled in the art can obtain other drawings without any creative effort.

DESCRIPTION OF EMBODIMENTS

In order to better understand objects, technical solutions and advantages of the present disclosure, the technical solutions in the embodiments of the present disclosure are clearly and completely described below with reference to the drawings. The described embodiments are a part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

Figure 1:
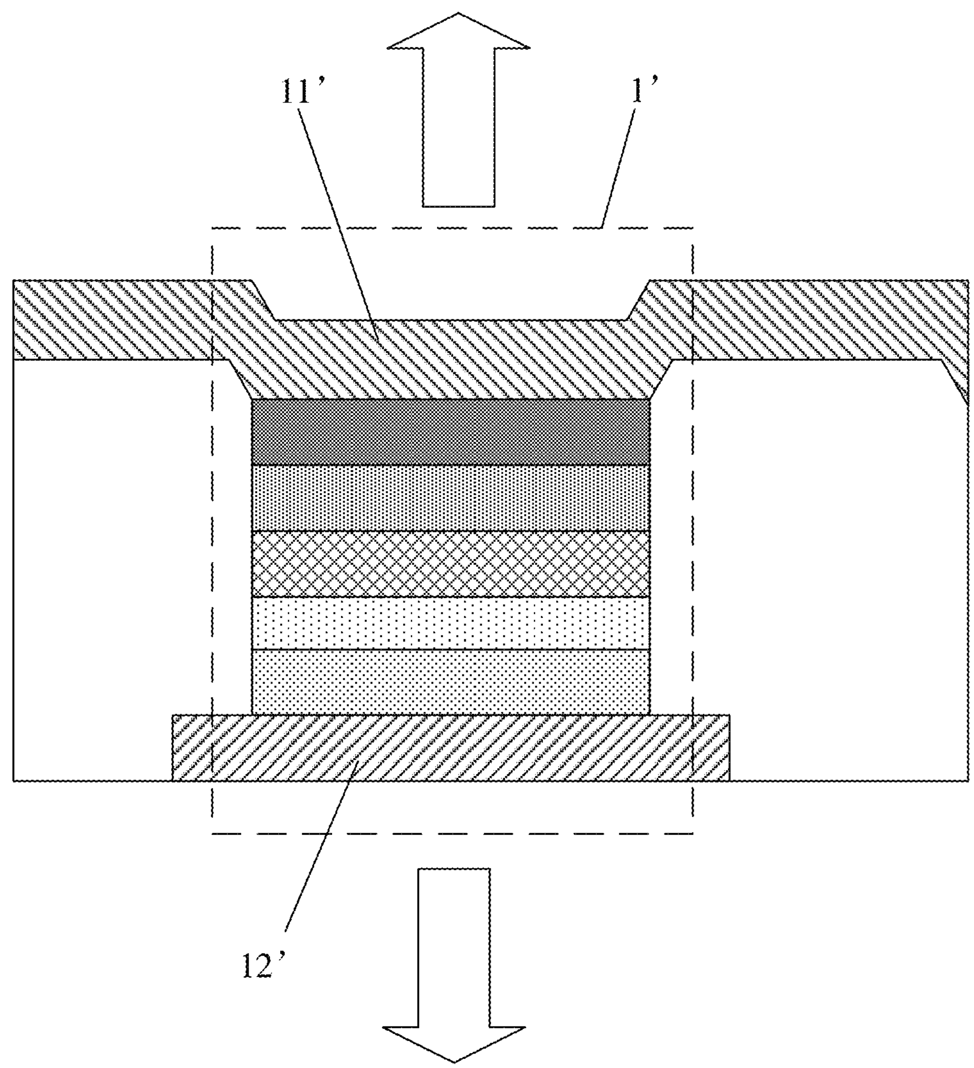
FIG. 1 is a partial cross-sectional structural schematic diagram showing an organic light-emitting display panel according to an embodiment of the present disclosure.

In order to further illustrate the beneficial effects of the embodiments of the present disclosure, before introduction of the embodiments of the present disclosure, the process of purposing the technical solution of the organic light-emitting display panel according to the embodiments of the present disclosure is firstly described. In the related art, an organic light-emitting component displaying at one side in an organic light-emitting display panel includes a total reflection electrode and a transparent electrode, and has a lower light intensity. In order to improve the light intensity of the organic light-emitting component, an organic light-emitting component having a microcavity is appeared, which includes a total reflection electrode and a semi-transparent electrode to form a microcavity between the total reflection electrode and the semi-transparent electrode, thus improving the light intensity of the organic light-emitting component by the microcavity effect. In order to apply it to the scenario which requires display at double sides, the inventors of the present disclosure have found that both electrodes of the organic light-emitting component can be arranged as transparent electrodes. FIG. 1 is a partial cross-sectional structural schematic diagram showing an organic light-emitting display panel according to an embodiment of the present disclosure. As shown in FIG. 1, if an organic light-emitting component 1' without a microcavity is used, that is, each of a first electrode 11' and a second electrode 12' of the organic light-emitting component is a transparent electrode, so that a same organic light-emitting component can emit light at opposite sides, in which the arrow in FIG. 1 is a light-out direction of the display panel. However, since there is no microcavity effect, the light intensity of the organic light-emitting component is low. For this purpose, the inventors have proposed technical solutions of the organic light-emitting display panel according to the embodiments of the present disclosure.

Figure 2:
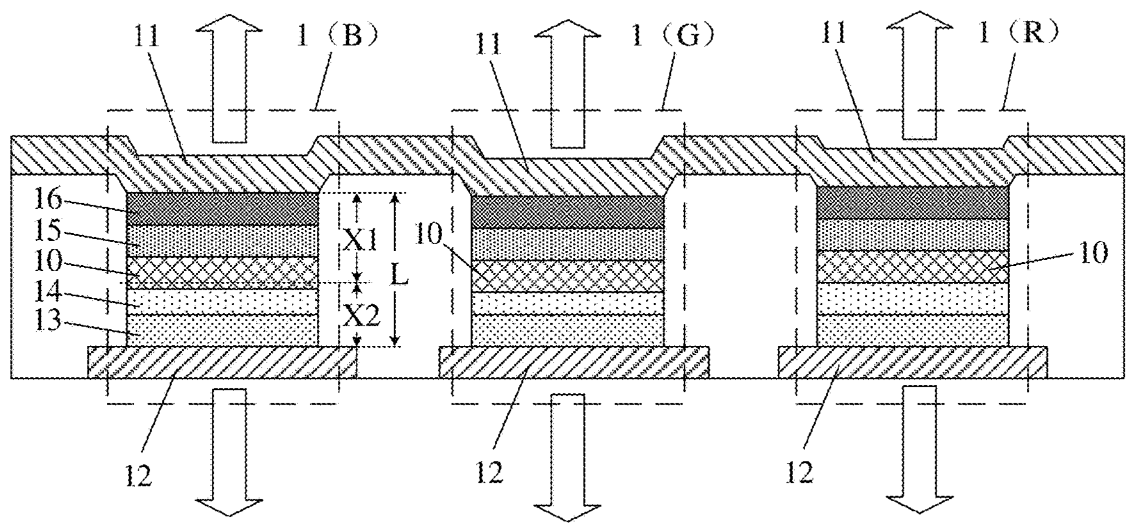
FIG. 2 is a cross-sectional structural schematic diagram showing a partial region of an organic light-emitting display panel according to an embodiment of the present disclosure.

FIG. 2 is a cross-sectional structural schematic diagram showing a partial region of an organic light-emitting display panel according to an embodiment of the present disclosure. As shown in FIG. 2, the present disclosure provides an organic light-emitting display panel including a plurality of organic light-emitting components 1. Each of the plurality of organic light-emitting components 1 includes a first electrode 11, a light-emitting layer 10, and a second electrode 12 that are arranged by stacking. The first electrode 11 has a reflectivity of R1, and the second electrode 12 has a reflectivity of R2. For a same one of the plurality of organic light-emitting components 1, R1 and R2 satisfy:

$$\begin{cases} I1 = F(R1, R2, \lambda, X1, L) \times I0 \\ I2 = F'(R1, R2, \lambda, X2, L) \times I0 \\ \left| \frac{I1}{I0} - \frac{I2}{I0} \right| < 0.13 \end{cases},$$

in which I1 is a light intensity of the first electrode 11 side, I2 is a light intensity of the second electrode 12 side, I0 is an intrinsic light intensity of the light-emitting layer 10. The intrinsic light intensity means a light intensity of a mere light-emitting layer 10, i.e., a light intensity of the light-emitting layer 10 without the microcavity effect, F (R1, R2, λ, X1, L) is a first function associated with R1, R2, 2, X1 and L, F' (R1, R2, λ, X2, L) is a second function associated with R1, R2, λ, X2 and L, λ is a wavelength of light emitted by the light-emitting layer 10, X1 is a distance between an exciton recombination center in the light-emitting layer 10 and the first electrode 11, X2 is a distance between an exciton recombination center in the light-emitting layer 10 and the second electrode 12, and L is a length of a microcavity between the first electrode 11 and the second electrode 12, in which X1+X2=L. In order to form a microcavity between the first electrode 11 and the second electrode 12 so as to increase the light intensity, each of the first electrode 11 and the second electrode 12 is a semi-transparent electrode. Therefore the reflectivity R1 of the first electrode 11 and the reflectivity R2 of the second electrode 12 satisfy: 5%≤R1≤95%, and 5%≤R2≤95%. The arrows in the drawings indicate a light-out direction.

Figure 3:
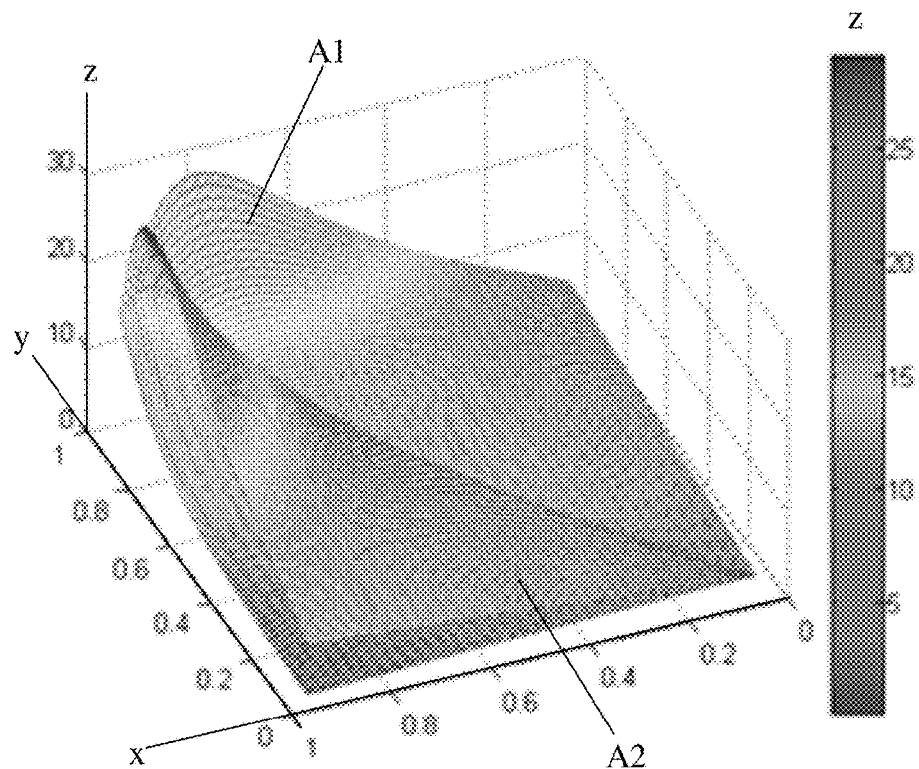
FIG. 3 is a simulation diagram of light intensity at double sides of a blue organic light-emitting component.

As shown in FIG. 3, FIG. 3 is a simulation diagram of light intensity at double sides of a blue organic light-emitting component. The first face A1 in FIG. 3 can be obtained by simulation according to formula (1): I1=F(R1, R2, λ, X1, L)×I0. The second face A2 in FIG. 3 can be obtained by simulation according to formula (2): I2=F' (R1, R2, λ, X2, L)×I0 can be simulated to obtain the second face in FIG. 3. Only a relation between R1, R2 and the light intensity is shown in FIG. 3. X coordinate represents reflectivity R1 of the first electrode 11, and Y coordinate represents reflectivity R2 of the second electrode 12, and z coordinate represents the light intensity. When $$\left| \frac{I1}{I0} - \frac{I2}{I0} \right| = 0,$$

the first face A1 and the second face A2 are overlapped, it indicates that the organic light-emitting component has same light intensity at both sides. In consideration of selection to the error and other parameters, the value can be fetched near the overlapping line between the first face A1 and the second face A2.

$$\frac{I1}{I0}$$

represents a magnification between the light intensity at one side of the first electrode 11 and the intrinsic light intensity of the light-emitting layer 10, so that R1 and R2 satisfy formula (3):

$$\left| \frac{I1}{I0} - \frac{I2}{I0} \right| < 0.13.$$

When the reflectivity R1 of the first electrode 11 and the reflectivity R2 of the second electrode 12 satisfy the formulas (1), (2), and (3) at the same time, it can be ensured that the difference in the light intensity of the organic light-emitting component at two sides is small. In addition, since each of the first electrode 11 and the second electrode 12 is a semi-transparent electrode, the organic light-emitting component can be realized to emit light at double sides.

With the organic light-emitting display panel according to the embodiments of the present disclosure, on the one hand, since each of the first electrode and the second electrode in the organic light-emitting component is a semi-transparent electrode, a microcavity is formed between the first electrode and the second electrode, thereby enhancing the light intensity and realizing light emitted at double sides. On the other hand, by determining the reflectivity of the first electrode and the reflectivity of the second electrode, it is ensured that the difference in the light intensity of light emitted at double sides is small and the display effect is further improved.

In an embodiment, $$F(R1, R2, \lambda, X1, L) = \frac{(1 - R2)\left[1 + R1 + 2\sqrt{R1} \times \cos\left(\frac{4\pi \times X1}{\lambda}\right)\right]}{1 + R1 \times R2 - 2\sqrt{R1 \times R2} \times \cos\left(\frac{4\pi \times L}{\lambda}\right)};$$

$$F'(R1, R2, \lambda, X1, L) = \frac{(1 - R1)\left[1 + R2 + 2\sqrt{R2} \times \cos\left(\frac{4\pi \times X2}{\lambda}\right)\right]}{1 + R2 \times R1 - 2\sqrt{R2 \times R1} \times \cos\left(\frac{4\pi \times L}{\lambda}\right)}.$$

In an embodiment, $$3.5 \le \frac{I1}{I0} \le 4.5;\ 3.5 \le \frac{I2}{I0} \le 4.5.$$

According to the obtained R1 and R2 satisfying the above formulas (1), (2), and (3), it can ensure that the difference in light intensity between the two sides of the organic light-emitting component is small. However, in order to further ensure a larger magnification of the light intensity, R1 and R2 are further determined under the condition satisfying $$3.5 \le \frac{I1}{I0} \le 4.5 \text{ and } 3.5 \le \frac{I2}{I0} \le 4.5.$$

In an embodiment, the plurality of organic light-emitting components 1 at least include a blue organic light-emitting component B, and a light-emitting layer 10 of the blue organic light-emitting component B includes a blue light-emitting material; and in the blue organic light-emitting component B, $$4.0 \le \frac{I1}{I0} \le 4.5, \text{ and } 4.0 \le \frac{I2}{I0} \le 4.5.$$

The plurality of organic light-emitting components 1 with different colors correspond to different wavelengths λ, and the simulation diagrams of the light intensity of the plurality of organic light-emitting components 1 with different colors emitting light at the two sides are also different. As shown in FIG. 3, according to a simulation result of the light intensity of the blue organic light-emitting component B emitting light at double sides, in which a maximum magnification of the light intensity is searched, and the range is $$4.0 \le \frac{I1}{I0} \le 4.5, \text{ and } 4.0 \le \frac{I2}{I0} \le 4.5.$$

In an embodiment, in the blue organic light-emitting component B, $$\left|\frac{I1}{I0} - \frac{I2}{I0}\right| < 0.01.$$

The plurality of organic light-emitting components 1 with different colors correspond to different wavelengths λ, and a range of the light intensity difference of the plurality of organic light-emitting components 1 with different colors emitting light at the two sides are also different. As shown in FIG. 3, according to a simulation result of the light intensity of the blue organic light-emitting component B emitting light at double sides, in which a smaller range of the difference in the light intensity is searched, and the range is $$\left|\frac{I1}{I0} - \frac{I2}{I0}\right| < 0.01.$$

In an embodiment, the plurality of organic light-emitting components 1 at least include a green organic light-emitting component G, and a light-emitting layer 10 of the green organic light-emitting component G includes a green light-emitting material; in the green organic light-emitting component G, $$3.5 \le \frac{I1}{I0} \le 5.5, \text{ and } 3.5 \le \frac{I2}{I0} \le 5.5.$$

Figure 4:
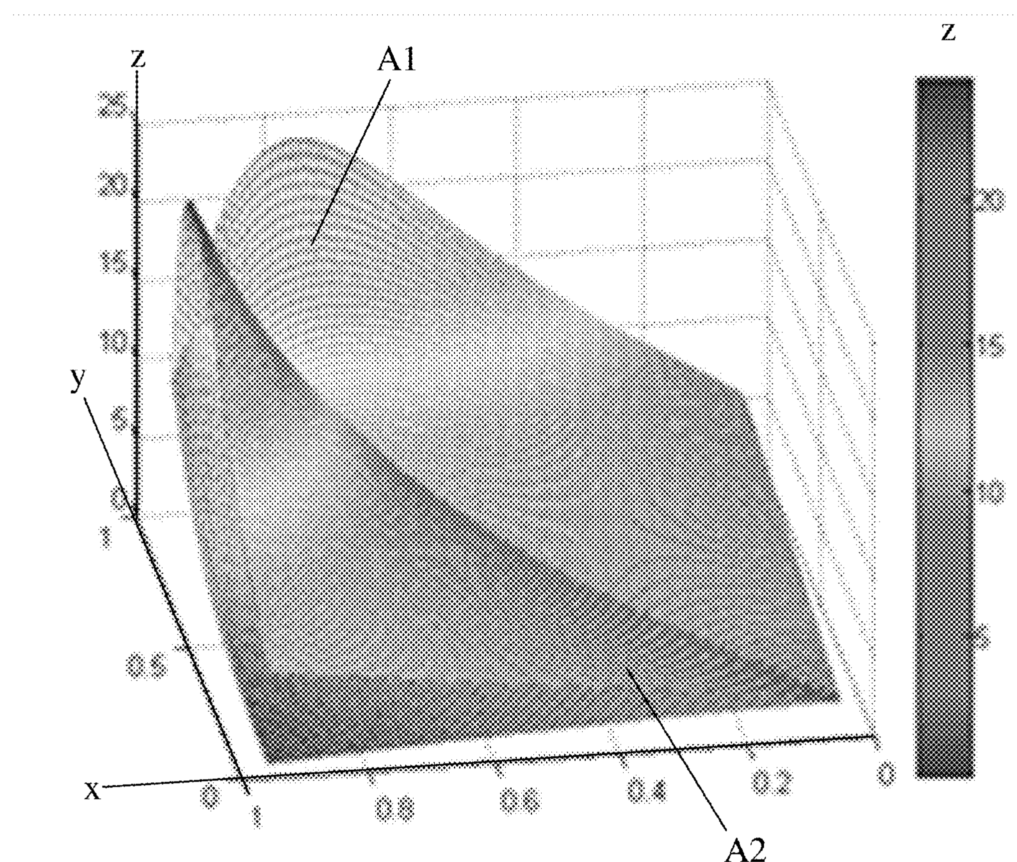
FIG. 4 is a simulation diagram of light intensity at double sides of a green organic light-emitting component.

FIG. 4 is a simulation diagram of light intensity at double sides of a green organic light-emitting component. As shown in FIG. 4, the plurality of organic light-emitting components 1 with different colors correspond to different wavelengths λ, and the simulation diagrams of the light intensity of the plurality of organic light-emitting components 1 with different colors emitting light at the two sides are also different. According to a simulation result of the light intensity of the green organic light-emitting component G emitting light at double sides, in which a maximum magnification of the light intensity is searched, and the range is $$3.5 \le \frac{I1}{I0} \le 5.5 \text{ and } 3.5 \le \frac{I2}{I0} \le 5.5.$$

In an embodiment, in the green organic light-emitting component G, $$\left|\frac{I1}{I0} - \frac{I2}{I0}\right| < 0.05.$$

The plurality of organic light-emitting components 1 with different colors correspond to different wavelengths λ, and a range of the light intensity difference of the plurality of organic light-emitting components 1 with different colors emitting light at the two sides are also different. As shown in FIG. 4, according to a simulation result of the light intensity of the green organic light-emitting component G emitting light at double sides, in which a smaller range of the difference in the light intensity is searched, and the range is $$\left|\frac{I1}{I0} - \frac{I2}{I0}\right| < 0.05.$$

In an embodiment, the plurality of organic light-emitting components 1 at least include a red organic light-emitting component R, and a light-emitting layer 10 of the red organic light-emitting component R includes a red light-emitting material; in the red organic light-emitting component R, $$4.5 \leq \frac{I1}{I0} \leq 5.5, \text{ and } 4.5 \leq \frac{I2}{I0} \leq 5.5.$$

Figure 5:
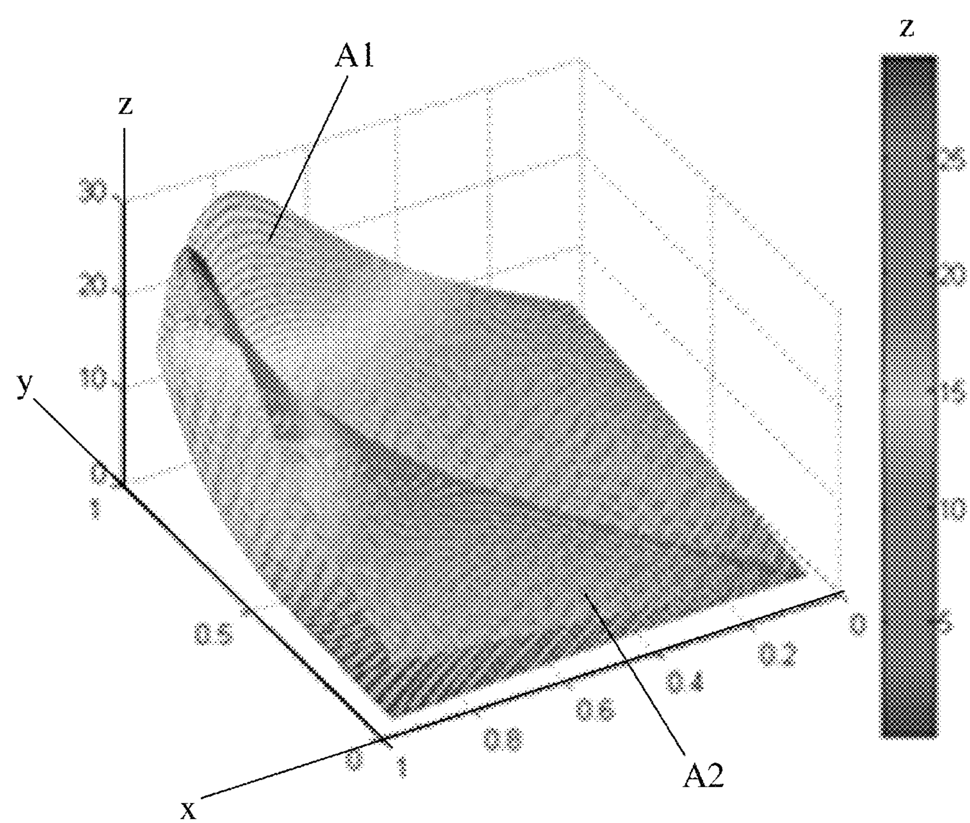
FIG. 5 is a simulation diagram of light intensity at double sides of a red organic light-emitting component.

FIG. 5 is a simulation diagram of light intensity at double sides of a red organic light-emitting component. As shown in FIG. 5, the plurality of organic light-emitting components 1 with different colors correspond to different wavelengths λ, and the simulation diagrams of the light intensity of the plurality of organic light-emitting components 1 with different colors emitting light at the two sides are also different. According to a simulation result of the light intensity of the red organic light-emitting component R emitting light at double sides, in which a maximum magnification of the light intensity is searched, and the range is $$4.5 \leq \frac{I1}{I0} \leq 5.5, \text{ and } 4.5 \leq \frac{I2}{I0} \leq 5.5.$$

In an embodiment, in the red organic light-emitting component R, $$\left|\frac{I1}{I0} - \frac{I2}{I0}\right| < 0.13.$$

The plurality of organic light-emitting components 1 with different colors correspond to different wavelengths λ, and a range of the light intensity difference of the plurality of organic light-emitting components 1 with different colors emitting light at double sides are also different. As shown in FIG. 5, according to a simulation result of the light intensity of the red organic light-emitting component R emitting light at double sides, in which a smaller range of the difference in the light intensity is searched, and the range is $$\left|\frac{I1}{I0} - \frac{I2}{I0}\right| < 0.13.$$

In an embodiment, each of the plurality of organic light-emitting components 1 further includes a hole injection layer 13, a hole transmission layer 14, an electron transmission layer 15, and an electron injection layer 16. The plurality of organic light-emitting components 1 includes organic light-emitting components with different colors, and hole transmission layers 14 in the plurality of organic light-emitting components 1 with different colors have different thicknesses.

In an embodiment, the first electrode 11 is a cathode, and the second electrode 12 is an anode. A hole injection layer 13, a hole transmission layer 14, a light-emitting layer 10, an electron transmission layer 15 and an electron injection layer 16 are sequentially arranged along a direction from the second electrode 12 facing towards the first electrode 11. The organic light-emitting components 1 at least include a blue organic light-emitting component B, a green organic light-emitting component G, and a red organic light-emitting component R. According to a result of the simulation for the light intensity of the organic light-emitting component 1 emitting light at double sides, the plurality of organic light-emitting components 1 with different colors corresponding to the different lengths L of the microcavity. In order to adjust the length L of the microcavity, the thickness of the hole transmission layer 14 is changed because the thickness variation can change the length L of the microcavity accordingly. However, the mobility of the hole transmission layer 14 is higher, so that the thickness variation has little effect on the function of the organic light-emitting component 1.

In an embodiment, the plurality of organic light-emitting components 1 includes organic light-emitting components 1 with different colors. First electrodes 11 in the plurality of organic light-emitting components 1 with different colors have same reflectivity R1, and second electrodes 12 in the plurality of organic light-emitting components 1 with different colors have same reflectivity R2.

The difference in the reflectivity R1 of the first electrodes 11 in the plurality of organic light-emitting components 1 with different colors is small, and the difference in the reflectivity R2 of the second electrodes 12 in the plurality of organic light-emitting components 1 with different colors is small. In addition, in the display panel, the first electrodes 11 and the second electrodes 12 in the plurality of organic light-emitting components 1 with different colors are usually formed by a same manufacturing process respectively, in order to save the manufacturing process. Because the materials manufactured by the same manufacturing process have same reflectivity, the plurality of organic light-emitting components 1 with different colors has same reflectivity R1 and same reflectivity R2.

In an embodiment, 40%≤R1≤55%, and 48%≤R2≤52%.

On the premise of the unified first electrode 11 and the second electrode 12, that is, when the first electrodes 11 and the second electrodes 12 in the plurality of organic light-emitting components 1 with different colors have same reflectivity R1 and same reflectivity R2 respectively, the ranges of the reflectivity R1 of the first electrode 11 and the reflectivity R2 of the second electrode 12 are searched, in which 40%≤R1≤55% and 48%≤R2≤52%.

Figure 6:
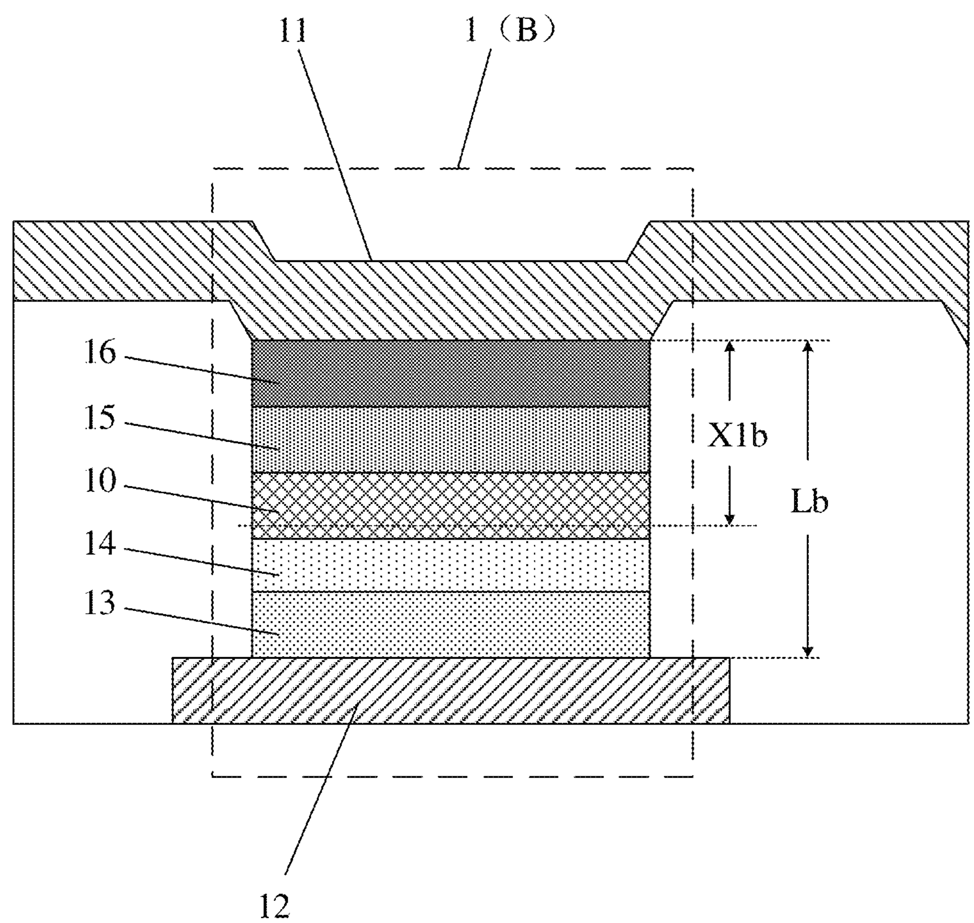
FIG. 6 is a structural schematic diagram showing the blue organic light-emitting display component in FIG. 2.

FIG. 6 is a structural schematic diagram showing the blue organic light-emitting display component in FIG. 2. In an embodiment, the plurality of organic light-emitting components 1 at least includes a blue organic light-emitting component B, and a light-emitting layer 10 of the blue organic light-emitting component B includes a blue light-emitting material. In the blue organic light-emitting component B, a distance between an exciton recombination center in the light-emitting layer 10 and the first electrode 11 is X1*b*, and 220 nm≤X1*b*≤240 nm; and a microcavity of the blue organic light-emitting component B has a length of Lb, and 910 nm≤Lb≤940 nm.

On the premise that R1 and R2 are satisfied, the organic light-emitting components B with different colors have different distances X1 between the exciton recombination center in the light-emitting layer 10 and the first electrode 11, and have different lengths L of the microcavity. As shown in FIG. 3, based on the ranges of the reflectivity R1 of the first electrode 11 and the reflectivity R2 of the second electrode 12, the specific range of the distance X1*b* between the exciton recombination center in the light-emitting layer 10 and the first electrode 11 is searched, and the specific range of the length Lb of the microcavity of the blue organic light-emitting component B is searched as well.

Figure 7:
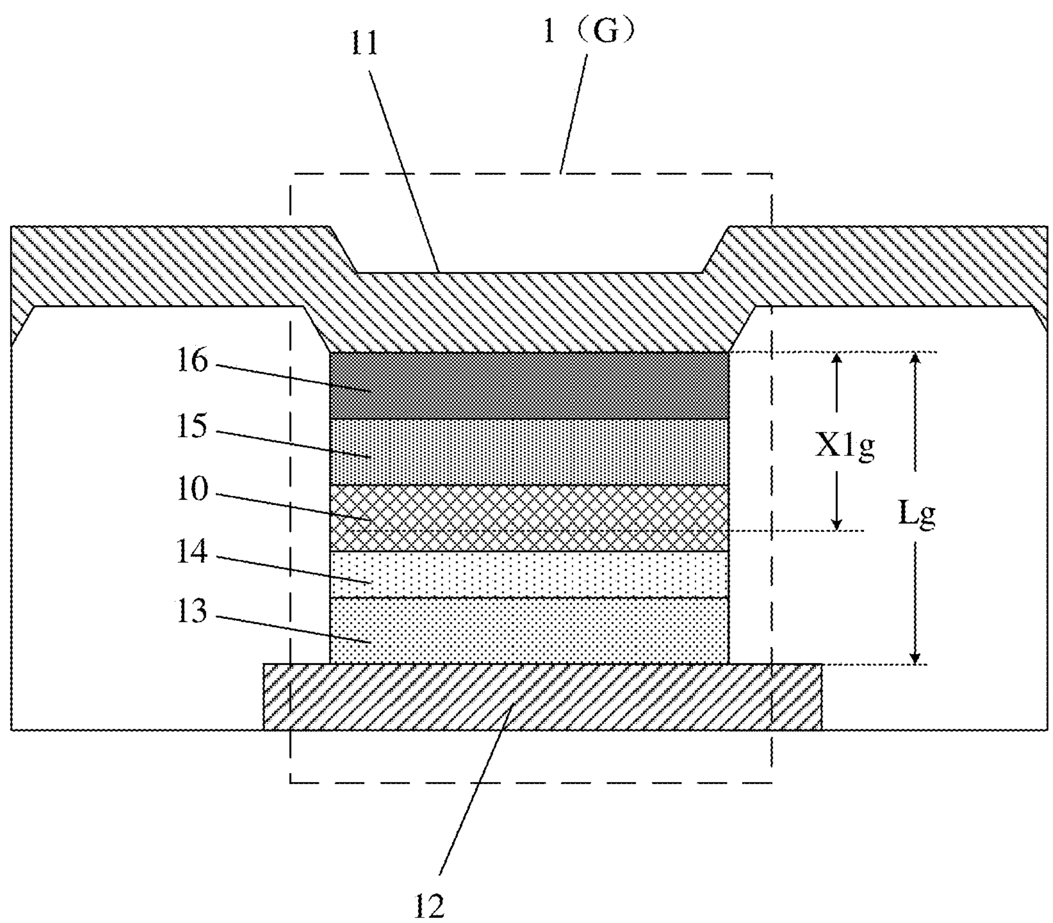
FIG. 7 is a structural schematic diagram showing the green organic light-emitting display component in FIG. 2.

FIG. 7 is a structural schematic diagram showing the green organic light-emitting display component in FIG. 2. In an embodiment, the plurality of organic light-emitting components 1 at least includes a green organic light-emitting component G, and a light-emitting layer 10 of the green organic light-emitting component G includes a green light-emitting material. In the green organic light-emitting component, a distance between an exciton recombination center in the light-emitting layer 10 and the first electrode 11 is X1*g*, and 510 nm≤X1*g*≤535 nm. A microcavity of the green organic light-emitting component G has a length of Lg, and 780 nm≤Lg≤820 nm.

As shown in FIG. 4, based on the ranges of the reflectivity R1 of the first electrode 11 and the reflectivity R2 of the second electrode 12, the specific range of distance X1*g* between the exciton recombination center in the light-emitting layer 10 and the first electrode 11 is searched, and the specific range of the length Lg of the microcavity of the green organic light-emitting component G is searched as well.

Figure 8:
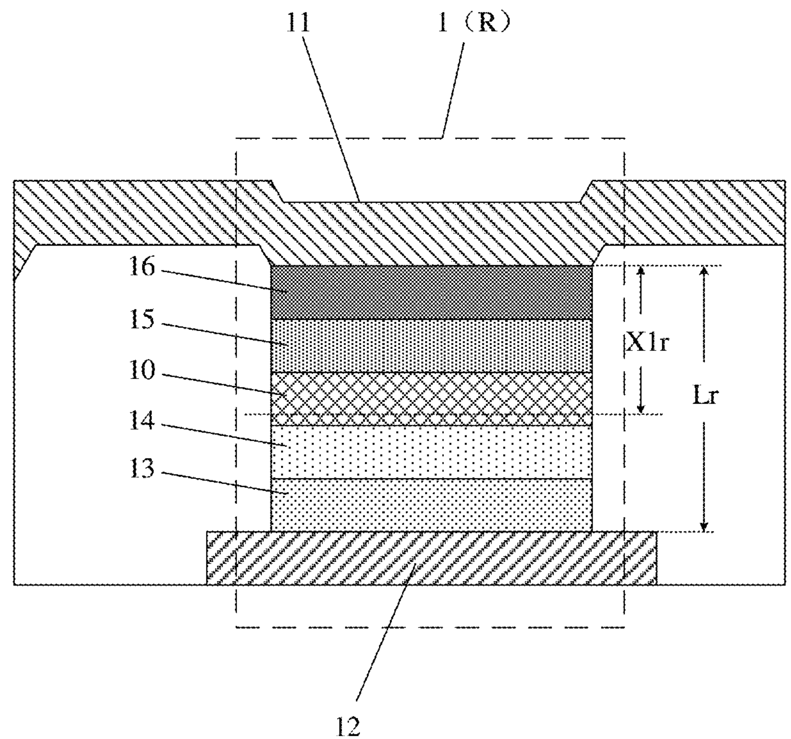
FIG. 8 is a structural schematic diagram showing the red organic light-emitting display component in FIG. 2.

FIG. 8 is a structural schematic diagram showing the red organic light-emitting display component in FIG. 2. In an embodiment, the plurality of organic light-emitting components 1 at least includes a red organic light-emitting component R, and a light-emitting layer 10 of the red organic light-emitting component R includes a red light-emitting material. In the red organic light-emitting component R, a distance between an exciton recombination center in the light-emitting layer 10 and the first electrode 11 is X1*r*, and 620 nm≤X1*r*≤660 nm. A microcavity of the red organic light-emitting component R has a length of Lr, and 930 nm≤Lr≤970 nm.

As shown in FIG. 5, based on the ranges of the reflectivity R1 of the first electrode 11 and the reflectivity R2 of the second electrode 12, the specific range of the distance X1*r* between the exciton recombination center in the light-emitting layer 10 and the first electrode 11 is searched, and the specific range the length Lr of the microcavity of the red organic light-emitting component R is searched as well.

It should be noted that, in the embodiments of the present disclosure, there are two principles for searching for the respective parameter range based on the simulation result: firstly, the difference in light intensity between the two sides of the organic light-emitting component 1 is small, secondly, the magnification of the light intensity on one side of the organic light-emitting component 1 is larger than that of the intrinsic light intensity of the light-emitting layer 10. In addition, in order to facilitate calculation during the simulation, the search can be performed within a preset conventional range, for example, based on a conventional setting mode for the length of the microcavity, i.e., 263 nm≤L≤1070 nm, in which the length of the microcavity is further determined in the above range. Similarly, based on the conventional setting mode for the exciton recombination center, i.e., 44 nm≤X1≤L-44 nm, the exciton recombination center position is further determined within the above range.

In an embodiment, one or both of the first electrode 11 and the second electrode 12 is selected from: an Ag material layer, a Mg—Ag material layer, and an ITO/Ag/ITO material layer. Any one of the above layers can satisfy 40%≤R1≤55% and 48%≤R2≤52%, and can meet the electrical performance requirements to the electrode itself.

Figure 9:
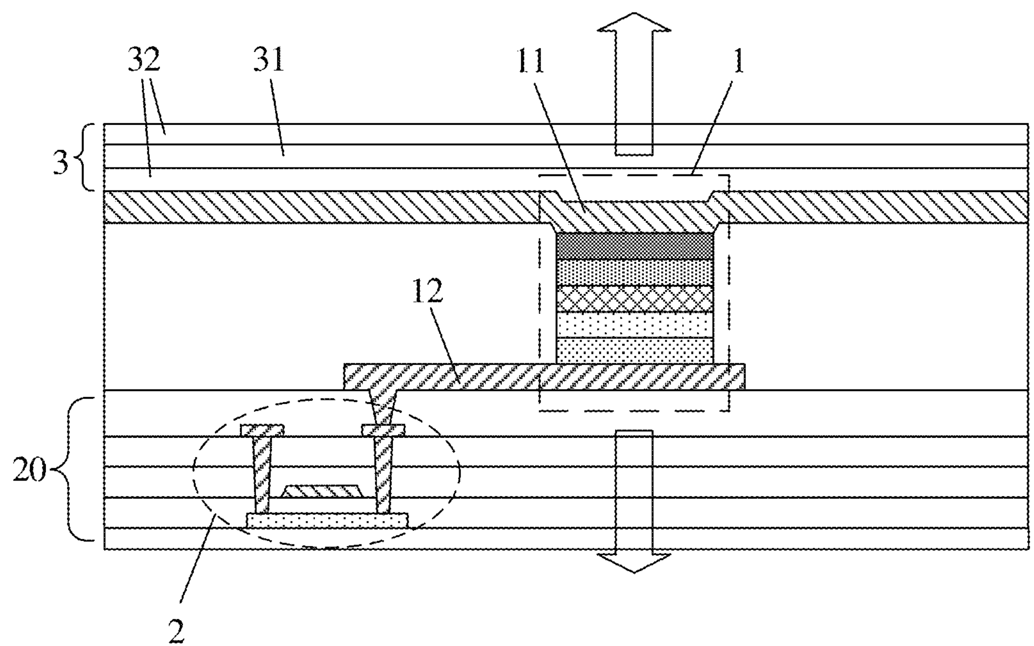
FIG. 9 is a cross-sectional structural schematic diagram showing a partial region of another organic light-emitting display panel according to an embodiment of the present disclosure.

FIG. 9 is a cross-sectional structural schematic diagram showing a partial region of another organic light-emitting display panel according to an embodiment of the present disclosure. The organic light-emitting display panel includes the organic light-emitting component 1 described above, a driving circuit layer 20, and an encapsulation layer 3. The driving circuit layer 20 includes a pixel driving circuit including a transistor 2. A drain electrode of the transistor 2 is electrically connected to the second electrode 12 of the corresponding organic light-emitting component 1. The pixel driving circuit is configured to drive the organic light-emitting component 1 to emit light. The magnitude of the current flowing through the organic light-emitting component 1 can be controlled by the pixel driving circuit, thereby controlling brightness of the organic light-emitting component and realizing the image display. Since it is required to display at double sides, the component in the pixel driving circuit needs to give way to the light-emitting region of the organic light-emitting component 1. The encapsulation layer 3 is located at a side of the organic light-emitting component 1 facing away from the driving circuit layer 20 so as to isolate the organic light-emitting component 1 from the outside. The encapsulation layer 3 may include at least one organic encapsulation layer 31 and at least one inorganic encapsulation layer 32 which are alternatively arranged by stacking. The organic encapsulating layer 31 can be a single layer or a stacked layer formed of a polymer such as polyethylene terephthalate, polyimide, polycarbonate, epoxy resin, polyethylene, polyacrylate, organosiloxane. The inorganic encapsulation layer 32 may include a metal, a non-metal, oxides of a metal or a non-metal, or a mixture thereof; fluorides of a metal or a non-metal, or a mixture thereof; nitrides of a metal or a non-metal, or a mixture thereof; carbides of a metal or a non-metal, or a mixture thereof; oxynitrides of a metal or a non-metal, or a mixture thereof; borides of a metal or a non-metal, or a mixture thereof; silicides of a metal or a non-metal, or a mixture thereof; an alloy of at least two metals; and an alloy of a metal and a non-metal. In an embodiment, the inorganic encapsulating layer 32 may include any one of $SiN_x$, $Al_2O_3$, $SiO_2$, and $TiO_2$. The inorganic encapsulation layer 32 is configured to insulate water and oxygen. The organic encapsulation layer 31 is configured to alleviate the stress of the encapsulation layer 3.

Figure 10:
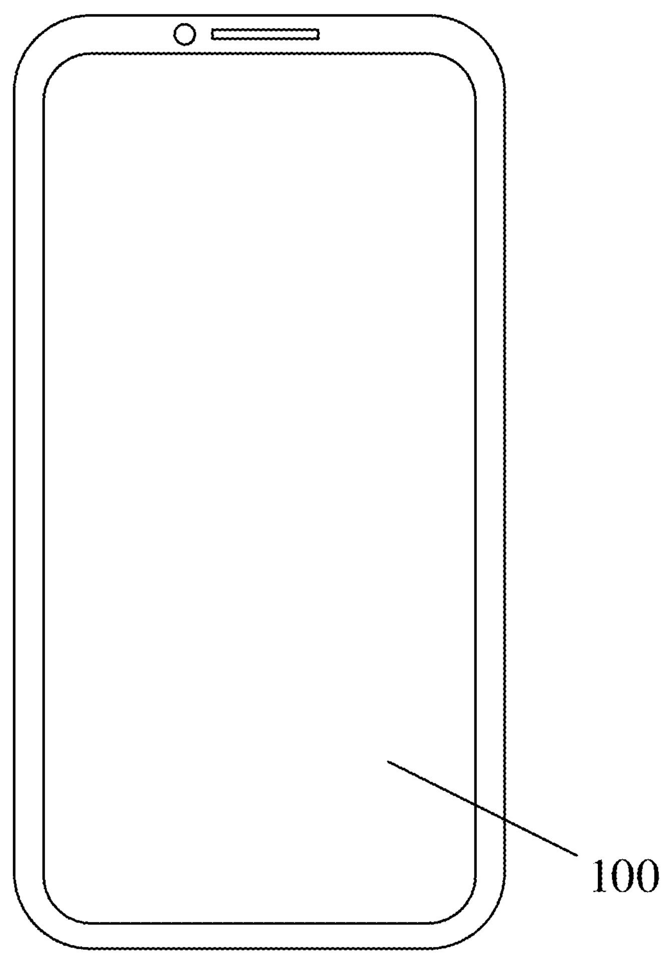
FIG. 10 is a structural schematic diagram showing a display device according to an embodiment of the present disclosure.

FIG. 10 is a structural schematic diagram showing a display device according to an embodiment of the present disclosure. An embodiment of the present disclosure further provides a display device including the organic light-emitting display panel 100 described above.

The specific structure and principle of the organic light-emitting display panel 100 has been described in detail in the above embodiments, which is not elaborated herein. The display device may be any electronic device having a display function such as a touch display screen, a mobile phone, a tablet computer, a laptop computer, an electronic paper book, or a television.

With the display device in the embodiments of the present disclosure, on the one hand, since each of the first electrode and the second electrode in the organic light-emitting component is a semi-transparent electrode, a microcavity is formed between the two electrodes to enhance a light intensity and to realize emitting light at double sides; on the other hand, by determining reflectivity of the first electrode and the second electrode, the difference in the light intensity of the double-sided light is ensured to be small, and the display effect is further improved.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. An organic light-emitting display panel, comprising a plurality of organic light-emitting components, wherein each of the plurality of organic light-emitting components comprises a stack of a first electrode, a light-emitting layer and a second electrode, the first electrode has a reflectivity of R1, the second electrode has a reflectivity of R2, and for a same one of the plurality of organic light-emitting components, R1 and R2 satisfy:

$$\begin{cases} I1 = F(R1, R2, \lambda, X1, L) \times I0 \\ I2 = F'(R1, R2, \lambda, X1, L) \times I0 \\ \left| \frac{I1}{I0} - \frac{I2}{I0} \right| < 0.13 \end{cases},$$

wherein I1 is a light intensity at a side of the first electrode, I2 is a light intensity at a side of the second electrode, I0 is an intrinsic light intensity of the light-emitting layer, F (R1, R2, λ, X1, L) is a first function associated with R1, R2, 2, X1 and L, F' (R1, R2, λ, X2, L) is a second function associated with R1, R2, 2, X2 and L, λ is a wavelength of light emitted by the light-emitting layer, X1 is a distance between an exciton recombination center in the light-emitting layer and the first electrode, X2 is a distance between the exciton recombination center in the light-emitting layer and the second electrode, and L is a length of a microcavity between the first electrode and the second electrode, wherein X1+X2=L, 5%≤R1≤95%, and 5%≤R2≤95%.

2. The organic light-emitting display panel according to claim 1, wherein $$F(R1, R2, \lambda, X1, L) = \frac{(1 - R2)\left[1 + R1 + 2\sqrt{R1} \times \cos\left(\frac{4\pi \times X1}{\lambda}\right)\right]}{1 + R1 \times R2 - 2\sqrt{R1 \times R2} \times \cos\left(\frac{4\pi \times L}{\lambda}\right)}, \text{ and}$$

$$F(R1, R2, \lambda, X2, L) = \frac{(1 - R1)\left[1 + R2 + 2\sqrt{R2} \times \cos\left(\frac{4\pi \times X2}{\lambda}\right)\right]}{1 + R2 \times R1 - 2\sqrt{R2 \times R1} \times \cos\left(\frac{4\pi \times L}{\lambda}\right)}.$$

3. The organic light-emitting display panel according to claim 2, wherein $$3.5 \leq \frac{I1}{I0} \leq 4.5, \text{ and}$$

-continued $$3.5 \leq \frac{I2}{I0} \leq 4.5.$$

4. The organic light-emitting display panel according to claim 3, wherein the plurality of organic light-emitting components at least comprise a blue organic light-emitting component, and the light-emitting layer of the blue organic light-emitting component comprises a blue light-emitting material; and in the blue organic light-emitting component, $$4.0 \leq \frac{I1}{I0} \leq 4.5, \text{ and } 4.0 \leq \frac{I2}{I0} \leq 4.5.$$

5. The organic light-emitting display panel according to claim 4, wherein in the blue organic light-emitting component, $$\left| \frac{I1}{I0} - \frac{I2}{I0} \right| < 0.01.$$

6. The organic light-emitting display panel according to claim 3, wherein the plurality of organic light-emitting components at least comprise a green organic light-emitting component, and the light-emitting layer of the green organic light-emitting component comprises a green light-emitting material; and in the green organic light-emitting component, $$3.5 \leq \frac{I1}{I0} \leq 5.5, \text{ and } 3.5 \leq \frac{I2}{I0} \leq 5.5.$$

7. The organic light-emitting display panel according to claim 6, wherein in the green organic light-emitting component, $$\left| \frac{I1}{I0} - \frac{I2}{I0} \right| < 0.05.$$

8. The organic light-emitting display panel according to claim 3, wherein the plurality of organic light-emitting components at least comprise a red organic light-emitting component, and the light-emitting layer of the red organic light-emitting component comprises a red light-emitting material; and in the red organic light-emitting component, $$4.5 \leq \frac{I1}{I0} \leq 5.5, \text{ and } 4.5 \leq \frac{I2}{I0} \leq 5.5.$$

9. The organic light-emitting display panel according to claim 8, wherein in the red organic light-emitting component, $$\left|\frac{I1}{I0} - \frac{I2}{I0}\right| < 0.13.$$

10. The organic light-emitting display panel according to claim 3, wherein each of the plurality of organic light-emitting components further comprises a hole injection layer, a hole transmission layer, an electron transmission layer, and an electron injection layer, and the plurality of organic light-emitting components comprises organic light-emitting components with different colors, and hole transmission layers in the organic light-emitting components with different colors have different thicknesses.

11. The organic light-emitting display panel according to claim 3, wherein the plurality of organic light-emitting components comprise organic light-emitting components with different colors, first electrodes in the organic light-emitting components with different colors have same reflectivity, and second electrodes in the organic light-emitting components with different colors have same reflectivity.

12. The organic light-emitting display panel according to claim 3, wherein 40%≤R1≤55%, and 48%≤R2≤52%.

13. The organic light-emitting display panel according to claim 12, wherein the plurality of organic light-emitting components at least comprise a blue organic light-emitting component, and the light-emitting layer of the blue organic light-emitting component comprises a blue light-emitting material;

in the blue organic light-emitting component, a distance between an exciton recombination center in the light-emitting layer and the first electrode is X1*b*, wherein 220 nm≤X1*b*≤240 nm; and a microcavity of the blue organic light-emitting component has a length of Lb, wherein 910 nm≤Lb≤940 nm.

14. The organic light-emitting display panel according to claim 12, wherein the plurality of organic light-emitting components at least comprise a green organic light-emitting component, and the light-emitting layer of the green organic light-emitting component comprises a green light-emitting material;

in the green organic light-emitting component, a distance between an exciton recombination center in the light-emitting layer and the first electrode is X1*g*, wherein 510 nm≤X1*g*≤535 nm; and a microcavity of the green organic light-emitting component has a length of Lg, wherein 780 nm≤Lg≤820 nm.

15. The organic light-emitting display panel according to claim 12, wherein the plurality of organic light-emitting components at least comprise a red organic light-emitting component, and the light-emitting layer of the red organic light-emitting component comprises a red light-emitting material;

in the red organic light-emitting component, a distance between an exciton recombination center in the light-emitting layer and the first electrode is X1*r*, wherein 620 nm≤X1*r*≤660 nm; and a microcavity of the red organic light-emitting component has a length of Lr, wherein 930 nm≤Lr≤970 nm.

16. The organic light-emitting display panel according to claim 1, wherein at least one of the first electrode and the second electrode is selected from a group consisting of an Ag material layer, a Mg—Ag material layer, and an ITO/Ag/ITO material layer.

17. A display device comprising the organic light-emitting display panel according to claim 1.

* * * * *